(12) United States Patent
Gauss et al.

(10) Patent No.: US 6,584,333 B1
(45) Date of Patent: Jun. 24, 2003

(54) PROTECTED SUPERCONDUCTING COMPONENT AND METHOD FOR PRODUCING THE SAME

(75) Inventors: Stephan Gauss, Sulzbach (DE); Joachim Bock, Erftstadt (DE); Johannes Holzem, Huerth (DE); Guenter Brommer, Wiesbaden (DE); Markus Grom, Kronberg (DE); Werner Horst, Bruehl (DE)

(73) Assignee: Nexans Superconductors GmbH, Huerth (DE)

( * ) Notice: Subject to any disclaimer, the term of this patent is extended or adjusted under 35 U.S.C. 154(b) by 0 days.

(21) Appl. No.: 09/762,240
(22) PCT Filed: Jul. 16, 1999
(86) PCT No.: PCT/EP99/05099
§ 371 (c)(1),
(2), (4) Date: May 9, 2001
(87) PCT Pub. No.: WO00/08657
PCT Pub. Date: Feb. 17, 2000

(30) Foreign Application Priority Data

Aug. 5, 1998 (DE) .......................... 198 35 454

(51) Int. Cl.⁷ .......................... H01B 12/00; H01L 39/06
(52) U.S. Cl. .......................... 505/220; 505/236; 505/703; 174/125.1
(58) Field of Search .......................... 505/230, 236, 505/124, 703, 704, 220, 887; 174/125.1

(56) References Cited

U.S. PATENT DOCUMENTS

| | | | |
|---|---|---|---|
| 5,043,320 A | * 8/1991 | Meyer et al. | 29/599 |
| 5,169,831 A | * 12/1992 | Yamamoto et al. | 428/688 |
| 5,298,679 A | * 3/1994 | Wu et al. | 174/15.4 |
| 5,384,307 A | * 1/1995 | Lay | 174/125.1 |
| 5,617,280 A | * 4/1997 | Hara et al. | 361/19 |
| 5,827,801 A | * 10/1998 | Tanaka et al. | 174/125.1 |
| 5,874,384 A | * 2/1999 | Balachandran et al. | 174/125.1 |
| 6,034,324 A | * 3/2000 | Dixon et al. | 174/15.4 |
| 6,034,588 A | * 3/2000 | Ando et al. | 174/125.1 |
| 6,038,462 A | * 3/2000 | Snitchler et al. | 174/125.1 |
| 6,159,905 A | * 12/2000 | Buzcek et al. | 174/125.1 |
| 6,284,979 B1 | * 9/2001 | Malozemoff et al. | 174/125.1 |
| 6,305,070 B1 | * 10/2001 | Masur et al. | 29/599 |

FOREIGN PATENT DOCUMENTS

EP  0 525 385 A1  2/1993

\* cited by examiner

*Primary Examiner*—Tom Dunn
*Assistant Examiner*—Colleen P. Cooke
(74) *Attorney, Agent, or Firm*—Sughrue Mion, PLLC

(57) ABSTRACT

The invention relates to a high-temperature superconductor component with a particular cross-sectional area, which has a current-carrying section, the current-carrying section being in contact with a safety conductor in such a way that the critical current flowing on transition of the superconductor to normal conduction can be taken up without damage by the safety conductor in at least 1 second and rerouted, as well as a process for its production.

12 Claims, 1 Drawing Sheet

PROTECTED SUPERCONDUCTING COMPONENT AND METHOD FOR PRODUCING THE SAME

DESCRIPTION

Figure 1A:
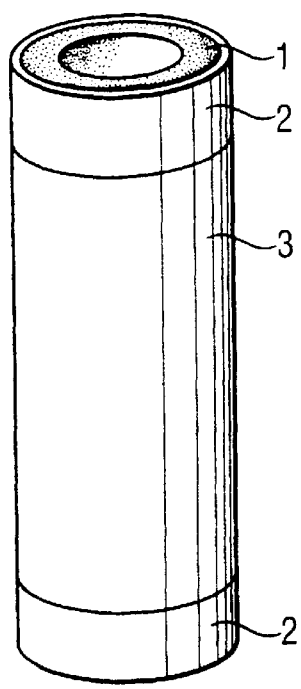

The invention relates to a high-temperature superconductor component with a particular cross-sectional area, which has a current-carrying section, the current-carrying section being in contact, in a safety region, with a safety conductor in such a way that in the safety region the current flowing on transition of the superconductor to normal conduction can be taken up without damage by the safety conductor in at least 1 second and rerouted, as well as a process for its production.

With the discovery of a ceramic material which exhibits the phenomenon of superconductivity at a comparatively high temperature, Bednorz und Muller (Z. Phys. B. 64, 189 (1986)) achieved the first significant improvement in the superconductivity transition temperature in the 1980s. The material used by Bednorz und Muller had a nominal composition $La_{2-x}M_xCuO_y$, in which M stood for calcium, barium or strontium, x typically varied around values between 0 and 0.3 and y was dependent on the production conditions. The highest superconductivity transition temperature was measured with the materials in which M stood for strontium and x stood for approximately 0.15 to 0.20. These materials had a transition temperature in the range of between approximately 40 and approximately 50 K (Cava et al., Phys. Rev. Letters, 58, 408 (1987)). In March 1987, Chu et al., Phys. Rev. Letters, 58, 405 (1987) reported that a material with the composition $Y_{1.2}Ba_{0.8}CuO_y$ exhibited a superconductivity transition temperature which lay between approximately 90 and 100 K.

Since these discoveries, another series of materials have been found which exhibit superconductivity at temperatures lying above the boiling point of liquid nitrogen. With these discoveries, superconductor technology therefore made a leap forward to wider applications, since current conduction without resistance no longer depended exclusively on extremely expensive and sensitive cooling of the superconductor material using liquid helium (boiling point: 4 K), but could be achieved even with substantially cheaper liquid nitrogen at a correspondingly high temperature.

However, a disadvantage with the newly discovered materials was that they were ceramic materials with which conventional processing methods for "conductors" could not be used. The ceramic superconductors have no degree of flexibility or ductility, were brittle and were not shapable. Machining of these materials therefore generally needed to be carried out with expensive diamond cutting tools at high cost.

This changed at least partially with the introduction of the so-called fusion casting process. This process, which is described in EP-B 0 462 409, opens up the possibility of producing, for example, cylindrical hollow moldings with different dimensions, for example thick-walled tubes with comparatively small diameter and fairly large length, as could be used in a power engineering application.

With growing understanding of the phenomena taking place in super-conductivity, as well as further development of the technology for processing ceramic superconductors, methods were developed making it possible to form the ceramic high-temperature superconductor material into flexible wires or strips in order to open up a range of application for high-temperature superconductor materials at least almost equivalent to normal conductors. For example, *IEEE Transactions on Magnetics, Vol. 25, No. 2*, March 1989 describes that strips of superconductor material can be obtained in the form of silver-clad wires. To that end, the corresponding materials giving rise to superconductors are for example mixed, calcined and sintered and then put into a silver tube. Through a pulling process, the diameter of the silver tubes is reduced in steps until a wire or a thin strip which can be processed with appropriate flexibility is created. The wires and strips which can be obtained in this way are generally also subjected to further treatment in order to produce or to optimize the required superconductor properties. When appropriate, with particular types of high-temperature temperature superconductors, it is also possible to put powder that is already superconducting into the corresponding silver tubes and then process them to form strips or wires. This method is generally known as the power in tube method (PIT). In such high-temperature superconductors in wire or strip form, the superconductor material is in the form of superconducting "grains". Although the current can flow very readily within the grains, current flow from grain to grain is, however, possible only along the grain boundaries which have inferior superconductor properties to the grains themselves. The grain boundaries are therefore generally referred to as weak links. Another disadvantage with such wire or strip systems is that the continuous cross-sectional areas of the high-temperature superconductor material are very small. Customary wires or strips have, for example, a cross-sectional area of about 0.4 mm$^2$, of which generally only about 30% corresponds to high-temperature superconductor material. It is therefore obvious that the critical current that can be achieved with such systems is very limited and is insufficient for many applications.

The use of silver in connection with high-temperature superconductors is described, for example, by M. Itoh, H. Ishigaki, T. Ohyama, T. Minemoto, H. Noijiri and M. Motokawa in *J. Mater. Res., Vol.* 6, 11, November 1991. They have shown that containing silver powder improves the electrical properties of a high-temperature superconductor material, in the present case based on Y, Ba, Cu and O. The authors describe high-temperature superconductors containing up to 28% by weight in powder form.

One already well-established and intensively investigated possible use for tubular components made of high-temperature superconductor material is represented by inductive current limiting. For example, U.S. Pat. No. 5,140,290 describes a device for inductive current limiting of an alternating current, in which the current to be limited flows through an induction coil. A hollow cylinder or a high-temperature superconductor is arranged in the interior of this coil, and a soft magnetic material with high permeability is arranged concentrically inside. In normal operation, or with rated current, the superconductivity of the hollow cylinder shields its interior, so that the impedance of the induction coil is very low. The current then flows circularly in the hollow cylinder, a flow of current does not take place along the longitudinal axis of the hollow cylinder.

With overcurrent, for example due to a mains short circuit, the superconductivity disappears and the impedance of the induction coil reaches its maximum current-limiting value. Such a voltage and current application when there are temporary overcurrents above the critical current and with electric voltages of a few mV/cm to V/cm lead to so-called "hot" points. Owing to minor nonuniformities in the material of the high-temperature superconductor, local peaks in the electric voltage occur. These lead to enhanced energy dissipation and therefore to heating at this point. The result is an increasing local peak in the resistance and therefore generation of a voltage drop. With prolonged application, such an effect leads to destruction of areas of the high-temperature superconductor.

Such "hot" points occur routinely in high-temperature superconductor materials since, during the production of such a material, variations in quality along the high-temperature superconductor, which have lower current-carrying capacity, may occur. "Hot" points generally have a small extent of about 0.01 to 0.5 mm. The overcurrents which occur are extra-ordinarily brief and range from periods of about 10 to 100 ms.

In order to stabilize such a component, DE-A 44 18 050 proposes to apply an about 1 to 10 µm thick silver layer to the surface of the superconductor. In order to mechanically stabilize the superconductor, an elastic steel wire winding is proposed which is fixed using solder or a synthetic resin which is stable at low temperatures, in such a way that an overall tensile stress on the armoring thus obtainable, or compression on the superconducting hollow cylinder, is maintained even below 100 K.

Accordingly, EP-A 0 822 560 also describes a tubular high-temperature superconductor arrangement which is used for inductive current limiting. The document indicates that, in the event of a short-circuit current in a high-temperature superconductor, vibrations occur in the latter and may lead to crack formation in the high-temperature superconductor ceramic unless protective measures are taken. In order to prevent crack formation, the high-temperature superconductor has a protective coil made of a fiber composite wound round it, by means of which tensile and compressive stresses are distributed more uniformly. A damping layer of oscillation-damping wadding or felt may be applied around such a protective coil. It is also described that a metallic normal-conductor layer for electrical stabilization is applied to the surface of the high-temperature superconductor. This layer is an about 1 µm thick metal layer, preferably a silver layer, which has mechanical armoring, preferably of steel wire, wound round it and is fastened using a conducting fixative.

EP-B 0 731 986 also describes a current-limiting device which is suitable for resistive limiting of both direct and alternating currents. A layered composite structure made up of superconductors and normal conductors is described, in which the layer thickness of the normal conductor should be selected in such a way that the electrical resistance of this layer is approximately equal to that of the layer of superconductor adjoining it in the non-superconducting state.

Besides the application as a current limiter, high-temperature superconductor components can be used both in tubular and in bulk configuration as current leads for high-temperature superconductor applications. Such current leads made of high-temperature superconductor material can, for example, be employed as current leads for superconducting magnets in nuclear magnetic resonance tomographs or spectrometers, in accelerator magnets or in research magnets. In this case, they generally represent the electrical connection between a 4 K temperature level and a 77 k temperature level. Since superconductor magnets are generally cooled using liquid helium, it is very important for the current leads of such magnets to have only minor thermal conductivity since, as already mentioned in the introduction, it is only possible to cool to 4 K using liquid helium which, on the one hand, is expensive and, on the other hand, requires sensitive and complex refrigerators. A current lead should therefore in principle have low thermal conductivity in order to protect the refrigerator and keep the cooling costs low.

Superconductor coils for generating strong magnetic fields generally need special protection. Even when using stabilized material and error-free design of the coil, reasons may occur (for example if gas enters the cryostat vacuum) causing the coil to become a normal conductor. The magnetic field then collapses and all of the energy stored in the magnetic field is converted into heat. In the case of large coils, this amount of energy is very considerable. A magnetic field of 5 T in a space 1 m$^3$ contains a stored field energy of $10^7$ Ws (approx. 2.8 k Wh). If this energy is converted rapidly into heat in an uncontrolled way on entering normal conduction, this can lead to complete destruction of the magnet.

In this context, a variety of processes can take place. If the electrical resistance of the coil in the normal conduction state is large, then the currents which occur do actually remain small so that destruction due to current heating is avoided. In this case, however, very high voltages occur during the field collapse, and can lead to voltage sparkovers between the turns of the coil. In order to avoid such catastrophic consequences of unintentional transition of the coil to normal conduction, for example in the case of large coils, protective devices are proposed which are suitable for extracting the stored energy as rapidly as possible from the magnet coil. To that end, *Supraleitung* [*Superconductivity*], 4th edition, VCH Weinheim, Werner Buckel, 1990, page 242 proposes connecting the coil to an external resistor which, in the event of field collapse, converts the majority of the stored energy into heat. Internal sparkovers are not, or not sufficiently, avoided by this. A further possibility consists in inductively extracting the stored energy from the magnet coil by surrounding the coil with a closed conductor having low self-inductance. In this method, however, all of the energy is delivered to the bath of liquid helium, and under certain circumstances this may cause explosive vaporization.

EP-A 0 837 478 describes a current lead, for a superconductor magnet system, which does not need liquid helium. A tubular current lead element made of high-temperature superconductor material is described, which has an electrode at each end. The current-carrying element reconciles a temperature conflict between an outer temperature level, which is at a temperature of about 77 K, and an inner temperature level which is at a temperature of about 4 K. The advantageously low conductivity of such a current lead is described, which only allows minor heat transfer from the hotter level to the colder one and therefore considerably reduces the cooling cost for the colder temperature level in comparison with normal conductor current leads.

Although such a high-temperature superconductor current-lead device on the one hand conducts current without resistance and, on the other hand, permits only minor heat transfer between the colder temperature reservoir and the hotter one, it does, however, represent a further risk factor in terms of collapsing of the high-temperature superconductor properties and transition to normal conduction.

All high-temperature superconductor materials can lose their superconductor properties by a) exceeding a critical temperature ($T_c$), b) exceeding a critical magnetic field ($H_c$), or c) exceeding a critical current ($I_c$), or by two or more of said events at the same time.

In these cases, the material becomes a normal conductor and a high resistance occurs. In the case of such a transition in a part of a high-temperature superconductor component or in the whole of the component through which current flows, the ohmic heat resulting from the high resistance can lead to destruction of the component in an extremely short time. The heat cannot be dissipated fast enough, so that the component may start to melt within seconds.

If such a component is used, for example, as a current lead to high-temperature superconductor magnet coils, then in such a case the current which is flowing, especially in magnet applications with high inductance, cannot be stepped down slowly enough because of the abrupt destruction of the current lead. As already described above with reference to the magnet coil application, this generally leads to destruction of the entire coil. In addition, voltage sparkovers possibly occurring in this case may under certain circumstances cause damage to the entire system and require expensive replacement of it.

In order to protect high-temperature superconductor current leads from such events, it has hitherto been necessary, for example, for additional external normal conductors to be connected in parallel, or to fit elaborate, fast and sensitive switches which, on registering a voltage drop across the high-temperature superconductor as a whole, cause the current to be switched off immediately. Such normal conductors or switching devices must in this case connect the upper and the lower ends of the part to be protected. They give rise to additional assembly outlay and require a great deal of space, and further, because of the cooling to cryogenic temperatures, care must be taken to ensure matched thermal expansion in relation to the high-temperature superconductor component itself. Fully continuous protection, in which the current everywhere throughout the entire high-temperature superconductor component can pass from the high-temperature superconductor to a normal conductor running in parallel, cannot be achieved with such a constructional design. What is more, fast, sensitive switches which are intended to detect the first indication of normal conduction within the high-temperature superconductor component, frequently lead to erroneous triggering which unnecessarily switches off the entire system.

A stabilized ceramic high-temperature superconductor as well as a process for its production are disclosed by DE-A 4 124 980. A ceramic high-temperature superconductor is described, in which a break is reliably stabilized to the extent that the current can be switched off in time. To that end, one or more metallic noble metal wires are introduced into the high-temperature superconductor components. However, this only ensures protection against small local cracks in the high-temperature superconductor and not against loss of the superconductor property in the component.

There was therefore a need for high-temperature superconductor components which do not have the disadvantages of the components known from the prior art. The object of the invention was therefore to provide a high-temperature superconductor component which, on exceeding a critical temperature ($T_c$), or on exceeding a critical magnetic field ($H_c$), or on exceeding a critical current ($I_c$), or on simultaneous occurrence of two or more of said events, sustains the current flowing in the high-temperature superconductor at least for a short time which is sufficient for the current conduction to be stepped down slowly enough and forwarded so as not to cause destruction of the high-temperature superconductor component and the system connected to it.

The object of the invention is achieved in that, in a safety region or in a plurality of safety regions, the high-temperature superconductor component is brought into contact with a normal-conduction safety conductor in such a way that the current flowing in such a safety region on transition of the high-temperature superconductor to normal conduction in this safety region can be essentially fully taken up for a period of at least 1 second without damage and rerouted by the normal conductor.

The invention therefore relates to a high-temperature superconductor component with a high-temperature superconductor cross-sectional area of at least 1 $mm^2$, which has a current-carrying section, the current-carrying section being connected to a safety conductor which is designed and arranged in such a way and is in electrical contact with the current-carrying section and at least partially covers the latter in a safety region or is at least partially enclosed by the latter, in such a way that the current flowing in the safety region of the current-carrying section on transition of the high-temperature superconductor to normal conduction in this safety region is essentially fully taken up for a period of at least 1 second without damage and rerouted by the safety conductor.

The term "essentially full" take-up and rerouting of the current are intended, in the scope of the present invention, to mean take-up and rerouting of an at least predominant part of the current flowing in the high-temperature superconductor under superconducting conditions. Since the high-temperature superconductor still exhibits (albeit small) conductivity even in the normal conduction state, the current flowing in the high-temperature superconductor under superconducting conditions does not pass to the safety conductor fully, but only "essentially fully" on transition to normal conduction in the component according to the invention. According to the rules of electrical engineering, a small fraction of the current still flows in the high-temperature superconductor, even in the normal conduction state.

In the scope of the invention, the term "high-temperature superconductor component" is intended to mean a component which facilitates current conduction without resistance over its entire length at about 30 K or above. High-temperature superconductor components according to the present invention accordingly contain a proportion of high-temperature superconductor material, a ceramic material being used as the high-temperature superconductor material.

The components according to the invention can thus be used at a temperature at which, by definition, "high-temperature superconduction" prevails. It is, however, also possible to use the components according to the invention at lower temperatures, that is to say at temperatures of below about 30 K, for example at about 4 K to about 25 K.

In a preferred embodiment of the invention, the high-temperature superconductor component has a proportion of high-temperature superconductor material of at least about 30% by weight, for example at least about 35% by weight, 40% by weight or more, for example at least about 50% by weight. It is likewise possible for the component according to the invention to have a proportion of high-temperature superconductor material of more than about 60 or 70% by weight. This proportion by weight refers in this case to the sums of the masses of high-temperature superconductor material, and the safety conductor as will be described in more detail below. Other auxiliary means, for example mechanical strengthening means, contact means, temperature sensors or voltage sensors along the component, which may also be applied to the component in addition, are not included in this calculation of the weight ratio.

In a preferred embodiment, the high-temperature superconductor component has a current-carrying section which consists of bulk high-temperature superconductor ceramic.

Such a bulk ceramic can, for example, be obtained by isostatic compression or by a casting process. All high-temperature superconductor materials which exhibit superconductor properties at 50 K or above, that is to say conduct current without resistance, are suitable as the high-temperature superconductor material. The high-temperature superconductor component presented in the scope of the present invention can be used both for the conduction of direct current and for the conduction of alternating current. In a preferred embodiment of the invention, this component is therefore used to conduct direct current, and in another preferred embodiment to conduct alternating current.

Examples of high-temperature superconductor materials which are especially suitable in the scope of the present invention include compounds with the composition $A_{1\pm x}M_{2\pm x}Cu_3O_y$, where A stands for Y or a combination of two or more of the elements Y, La, Lu, Sc, Sm, Nd or Yb. M here stands for Ba or a combination of two or more of the elements Ba, Sr or Ca and y stands for a number at which said material becomes superconducting at a temperature higher than 30 K, in particular at at least about 77 K. The compounds involve single-phase perovskite-like crystalline structures which for example are prepared by mixing the metal oxides, or compounds which are converted to metal oxides on heating, in suitable molar ratios, heating the mixture in the presence of oxygen to a temperature of between about 800 and about 1100° C. and slowly cooling the mixture in the presence of oxygen over a period of at least about one hour. Specific examples of suitable materials include $(Y_{0.8}Lu_{0.2})_{1.0}Ba_{2.0}Cu_3O_y$, $(Y_{0.5}Lu_{0.5})_{1.0}Ba_{2.0}Cu_3O_y$, $(Y_{0.5}La_{0.5})_{1.0}Ba_{2.0}Cu_3O_y$, $(Y_{0.5}Sc_{0.5})_{1.0}Ba_{2.0}Cu_3O_y$, $(La_{0.5}Sc_{0.5})_{1.0}Ba_{2.0}CU_3O_y$, $Y_{1.0}(Ba_{0.5}Ca_{0.5})_{2.0}Cu_3O_y$, $Y_{1.0}(Sr_{0.5}Ca_{0.5})_{2.0}CU_3O_y$, $Y_{0.8}Ba_{2.0}Cu_3O_y$, $Y_{1.2}Ba_{2.0}Cu_3O_y$, $Y_{1.0}Ba_{1.8}Cu_3O_y$, $Y_{1.0}Ba_{1.5}Cu_3O_y$, $Y_{1.2}Ba_{1.8}Cu_3O_y$. One especially suitable group of materials consists of those known by the reference YBCO-123 and YBCO-211, the numerical combinations 123 and 211 standing for the stoichiometric ratios of the elements Y, Ba and Cu.

Examples of other suitable ceramic materials which exhibit high-temperature superconductivity at a temperature of 30 K or above include compounds with the general formula $(Bi_{1-x}A_x)$—$B_y$—$C_z$—CuO, in which A stands for Sb or As or a mixture thereof, B and C are respectively different and stand for one or more element selected from the group consisting of Be, Mg, Ca, Sr and Ba, $0 \leq x < 1.0 < y \leq 5$ and $0 < z \leq 5$. The (not indexed) proportion of oxygen is, in this case, about 3 to 5 in the general formula given above, depending on the production process and the desired properties.

In said oxide compounds, it is essential to combine bismuth (Bi) and copper (Cu) with at least two or more elements selected from the group Be, Mg, Ca, Sr, Ba and Pb. If appropriate, Bi may be partially substituted by Sb or As or both. A combination of Bi, Sr, Ca, Cu and O is particularly preferred. Said compounds are prepared by mixing oxides, carbides or carbonates or mixtures of two or more thereof of said elements in suitable mixing ratios. Subsequently, calcining is carried out at a temperature of about 700 to 900° C. for a period of about 2 to about 20 hours, the calcined mixture is ground, converted into a suitable form and sintered at temperatures of about 800 to about 1100° C. in the semi- or fully-molten state. Compounds of said type exhibit, for example, a superconductivity transition temperature higher than 105 K and are extraordinarily stable. Examples of compounds of said type are found, for example, in EP-B 0 330 305, to which reference is expressly made here.

Other compounds suitable for use as a high-temperature superconductor material in the scope of the present invention are, for example, described in EP-A 0 327 044, to which reference is likewise expressly made. These are high-temperature superconductor substances with Bi, Sr, Ca, Cu and O contents which have an empirical composition $Bi_a(Sr,Ca)_bCu_6O_x$, where a=3 to 24 and b=3.23 to 24 and the Sr/Ca atomic ratio is about 1:9 to 9:1. The Bi:(Ca+Sr) atomic ratio is about 0.3 to about 1.5. Said compounds are conventionally referred to as BSCCO, the letter B standing for the element bismuth, the letter S for strontium, the first letter C for calcium, the second letter C for copper and O for oxygen. On the basis of their composition of the compounds, the high-temperature superconductor materials described above are also frequently characterized by their elemental composition. Thus, the reference BSCCO-2212 stands for high-temperature superconductor materials with the composition $Bi_2Sr_2CaCu_2O_x$ and the reference BSCCO-2223 stands for compounds with the stoichiometric composition $Bi_2Sr_2Ca_2Cu_3O_x$. In the literature, the compounds are also, for example, frequently referred to by the number of layers which make up their structure. Thus, for example, BSCCO-2212 is frequently referred to as "two-layer" and BSCCO-2223 as "three-layer".

Said high-temperature superconductor materials may, if appropriate, also contain $SrSO_4$ or $BaSO_4$ as auxiliaries in an amount up to 20% by weight (when $BaSO_4$ is used, preferably only up to about 10% by weight). Also usable in the scope of the present invention are compounds of the BSCCO class in which some of the bismuth has been replaced by lead. Such compositions are conventionally also referred to as Pb-BSCCO. For example, the lead compound $(BiPb)_2Sr_2Ca_2Cu_3O_{10}$ is suitable for use in the scope of the present invention.

Also suitable are high-temperature superconductor materials as are mentioned for example in EP-B 0 659 704 and to which reference is expressly made, which also contain at least mercury besides the elements barium, calcium, copper and oxygen. In addition, yet another element or a mixture of two or more other elements selected from the group Pb, Bi, Tl, Au, Pt, Ag or Cd may be contained. High-temperature superconductor oxides with the composition (Hg, Pb), Ba, Ca, Cu in the stoichiometric composition 1223 are, for example, described by K. Isawa et al. in *Physica*, C217 (1993), 11–15. Reference is hereby expressly made to both said documents.

Other suitable high-temperature superconductor materials are described in WO 95/08517, to which reference is likewise expressly made. The publication describes oxide ceramic high-temperature superconductors containing thallium, with which for example bulk ceramic components can be obtained. Said high-temperature superconductor compounds have, for example, the formula composition $Tl/PbCa_{n-1}Ba_2Cu_nO_x$, $(Tl/Pb)_2Ca_{n-1}Ba_2Cu_nO_y$ or $Tl_{0.5}Pb_{0.5}Ca_{n-1}Sr_2Cu_nO_z$. Here, n stands, for example, for the numbers 1, 2 or 3. The materials have high-temperature superconductivity transition temperatures ($T_c$) significantly above 77 K, for example about 118 to about 122 K. The discovery and characterization of the compounds is for example described by Z.Z. Cheng et al. in *Nature, Vol.* 332, page 55 (1988).

Also suitable are, for example, high-temperature superconductor materials as are described in EP-A 0 573 804. Such high-temperature superconductors of the BSCCO class have a carbon content of about 200 to about 800 ppm (by weight) in order to increase the critical current density in the equilibrium state.

The high-temperature superconductor component according to the present invention is not limited in terms of its three-dimensional shape, and the safety conductor design according to the invention, explained below, can be applied to high-temperature superconductor components of virtually all three-dimensional shapes. Components preferred in the scope of the present invention have, however, an elongate shape in which the length of the component is a multiple of the component cross section. In the scope of the present invention, the term multiple is not intended only to mean integer multiples. The high-temperature superconductor component may in this regard have a linear shape, but may likewise also be bent in a meandering shape or wound in a spiral shape, if a suitable production method allows this.

In a preferred embodiment, however, the high-temperature superconductor component according to the invention is essentially linear and has a length of at least about 1 cm. The length of the high-temperature superconductor component is essentially unlimited and is usually dictated by the nature of the application. Thus, in the context of using the high-temperature superconductor components according to the invention as current leads to high-temperature superconductor magnets, component lengths of about 5 to about 100 cm, for example about 10 to about 50 cm, are generally required.

The cross-sectional surface of the high-temperature superconductor component can have any desired external shape, which merely depends on the nature of the preparation. For example, circular, oval or polygonal, in particular triangular, quadrilateral, for example square or rectangular, pentagonal or hexagonal cross-sectional surfaces are possible.

The high-temperature superconductor component may in this case be in bulk form, that is to say a cross section through the component is entirely filled with high-temperature superconductor material. The high-temperature superconductor component may, however, also be hollow, that is to say a cross section through the component has a free surface enclosed by high-temperature superconductor material. In the scope of the present invention, both bulk and hollow high-temperature superconductor components may be used, which in a preferred embodiment may be designed as tubes or as a rod.

The cross-sectional area of the high-temperature superconductor material is, in a preferred embodiment, at least about 2 mm$^2$, in particular more than about 5 mm$^2$. For example, in the scope of the present invention, components which have a cross-sectional area of about 25 mm$^2$, about 50 mm$^2$, about 500 mm$^2$, about 1300 mm$^2$ or about 2000 mm$^2$, are suitable.

The high-temperature superconductor component according to the invention has at least one current-carrying section. The current-carrying section denotes that section of the high-temperature superconductor component which is used for the current conduction and has no other contact function except, where appropriate, for contacts to measuring instruments which, for example, monitor the current flow or temperature in the current-carrying section. The current-carrying section of the high-temperature superconductor component according to the invention is at least partially, that is to say in the safety region or the safety regions, in contact with a safety conductor which is preferably a normal conductor. The term "partial" contact with the safety conductor is intended, in the scope of the present text, to mean that the current-carrying section need not be in contact with the safety conductor over its entire length, but instead particular length portions of the current-carrying section have no contact with the safety conductor.

The term "safety region" denotes, in the scope of the present text, the region or those regions of the current-carrying section in which, on transition of the high-temperature superconductor material to normal conduction, the current conduction can be undertaken by the safety conductor at least temporarily, that is to say for a period of at least one second.

In a preferred embodiment, the high-temperature superconductor components according to the present invention have end sections which are designed as contacts. The term "end sections" denotes those sections of the high-temperature superconductor component according to the invention which are in both mechanical and electrical contact with an electrical source or a load. The term electrical source is in this context intended to mean any form of current lead which delivers current to the high-temperature superconductor component and is therefore in electrical contact but is otherwise only connected non-positively or by interlocking, or both. The term current take-off is intended to mean a component which, using the current delivered by the high-temperature superconductor component, achieves a particular effect, for example creates a magnetic field.

The end sections of a preferred embodiment of the high-temperature superconductor component are designed as contacts, that is to say they have contact means which allow electrical connection of the high-temperature superconductor component to other electrical sources or loads. Such electrical connection can, for example, be made by surrounding the high-temperature superconductor component in the periphery of the end sections with an electrically conductive metal, preferably in the entire periphery of the end sections. The electrically conductive metal is in this case in contact with the high-temperature superconductor material in the region of the end section, in such a way that superconductor material in the region of the end section, in such a way as to provide the lowest possible junction resistance when the current is transferred from a current lead or to a current take-off through the metal to the high-temperature superconductor material, or vice versa. This resistance is preferably less than 2 $\mu\Omega\cdot$cm (77 K), for example less than 1.5 $\mu\Omega\cdot$cm, 1 $\mu\Omega\cdot$cm or 0.5 $\mu\Omega\cdot$cm.

In another preferred embodiment, the high-temperature superconductor component has two end sections, whose length taken together amounts to less than about 40% of the total length of the high-temperature superconductor component.

The contact between the high-temperature superconductor component and a current lead or a current take-off is for example made by suitably formed copper contacts which enclose the high-temperature superconductor component essentially over the entire periphery and essentially over the entire length of the end sections.

In a preferred embodiment of the invention, the high-temperature superconductor component is in contact to a full extent with the safety conductor on at least part of the current-carrying section in the safety region. Preferably, such a part of the current-carrying section lies in the vicinity of one of the end sections or adjoins, in particular, one of the end sections. In another preferred embodiment, the high-temperature superconductor component is in contact with the safety conductor via the entire surface of the current-carrying section over its entire length.

In another preferred embodiment, the safety region makes up at least 10% of the surface area of the high-temperature superconductor component. Preferably, the contact between the safety conductor and the component is continuous and uninterrupted surface-wide. If the high-temperature superconductor component is used in a temperature gradient, then it is preferred in the scope of the present invention if the safety conductor covers at least 30% of the surface adjoining an end section or respective end sections which are in contact with the hotter temperature level. That is to say, in a preferred embodiment of the invention, there is at least one safety region at one such end section of the component.

The contact between the safety conductor and the high-temperature superconductor material may end abruptly inside the current-carrying section, but it is also possible to provide a transition zone in which the contact between the high-temperature superconductor material and the safety conductor decreases gradually, or the current-carrying capacity of the safety conductor is gradually reduced. Such a reduction of the current-carrying capacity may, for example, be obtained by gradually reducing the thickness of the safety conductor progressively from the original thickness to a substantially smaller thickness. The contact between the high-temperature superconductor material and the safety conductor may also be reduced gradually by making holes in the safety conductor, the area occupied by these holes increasing with increasing distance from full-surface coverage of the high-temperature superconductor material by the safety conductor. Such holes may, for example, be of triangular or rhombic shape, and may extend over relatively short length sections or over length sections which involve the entire current-carrying section length not covered surface-wide by the safety conductor.

The safety conductor may therefore either be in electrical contact with all end sections designed as a contact or, wherever, there may only be electrical contact at one end section between the safety conductor and the end section designed as a contact.

In a preferred embodiment of the invention, the safety conductor should always be electrically connected to at least one end section designed as a contact. Such a contact may, for example, be achieved by making a connection with high electrical conductivity between the end section designed as a contact and the safety conductor, using suitable aids, for example solder. It is, however, also possible to make the contact from the same material as the one which the safety conductor consists of, and to form the contact leading from the end section as a safety conductor merging into the current-carrying section.

If the high-temperature superconductor component according to the invention is hollow, that is to say it has a cavity enclosed over the entire surface by high-temperature superconductor material, then the safety conductor need not necessarily be in contact with the outward surface of the high-temperature superconductor component, but may equally well be applied to the inward surface of the component.

It is further possible, and in the scope of the present invention intended as a preferred embodiment, for the safety conductor not to lie on one of the surfaces of the high-temperature superconductor component but to be fully or partially enclosed by the high-temperature superconductor material. What is crucial in this regard is that the underlying concept of the invention can be implemented, that is to say at least current flowing in part of the high-temperature superconductor can switch to the safety conductor and, where appropriate, back from the safety conductor to the high-temperature superconductor component.

As the material for the safety conductor, all materials which are capable of taking up the critical current flowing in the high-temperature superconductor component in the sections that are in contact with the safety conductor on transition of this section of the high-temperature superconductor component to the normal-conduction state and rerouting it for a period of at least one second, without destruction of the high-temperature superconductor component or of the safety conductor taking place, are suitable. In a preferred embodiment of the invention, the safety conductor is configured and dimensioned in such a way that rerouting of the current over a period of at least 10 seconds or more is provided. Suitable and sufficient times for which the current can be rerouted without problems may, for example, amount to about 60 seconds or more, for example about 120 seconds or even longer.

Such a material may, for example, be a correspondingly conductive plastic, but in the scope of the present invention a metal is preferably used as the material for the safety conductor. Noble metals, in particular Ag, Au, Pt, Rh, Pd, Ru, Os or Ir or mixtures of two or more thereof are especially suitable.

In a preferred embodiment, a material which is permeable to oxygen is used as the material for the safety conductor.

Ag, or an alloy of Ag with Au is preferably used as the material for the safety conductor, the proportion of Au amounting for example to about 0.1 to about 20% by weight.

In a preferred embodiment of the invention, silver plate or a metal sheet made of an alloy of silver and gold is used as the safety conductor. The safety conductor is in this case, for example, in laminar contact with the surface of the high-temperature superconductor material. In a preferred embodiment of the invention, the safety conductor has a thickness of about 20 $\mu$m to about 800 $\mu$m. At lower thicknesses, damage-free take-up and rerouting of the current flowing in the corresponding section of the high-temperature superconductor may no longer be guaranteed, and at larger layer thicknesses, the thermal conductivity of the high-temperature superconductor component may possibly become disadvantageously high.

If appropriate, it may be necessary or preferred if the high-temperature superconductor component with the safety conductor is enclosed by an additional reinforcing layer. The additional reinforcing layer may in this case sheath the high-temperature superconductor component over its entire surface, albeit at least with the exception of the end sections designed as contacts, or may sheath the component, and be in contact with it, merely in subregions of the high-temperature superconductor component. The strengthening layer may consist of an electrically conductive or of an electrically nonconductive material. Preferably, the strengthening layer consists of metal and has a thickness of about 40 $\mu$m to about 10 mm. In a preferred embodiment, the strengthening layer contains copper, iron, nickel or silver or a mixture of two or more thereof.

If appropriate, it may be advantageous if, on the strengthening layer, the high-temperature superconductor component extensively has one or more sections which are connected to a metal whose heat capacity is greater than the heat capacity of the strengthening layer. Such sections are generally applied as heat sinks, which, if appropriate, store the heat dissipated during a normal-conduction phase of the high-temperature superconductor component and slowly release it again during a subsequent cooling phase.

The high-temperature superconductor component according to the invention will be explained in more detail in the drawing, in which FIG. 1a represents a tubular high-temperature superconductor component in which a tube of high-temperature superconductor material (1) has two end sections (2) designed as contacts, and the current-carrying section lying in between is enclosed over its entire surface by a safety conductor (3).

Figure 1B:
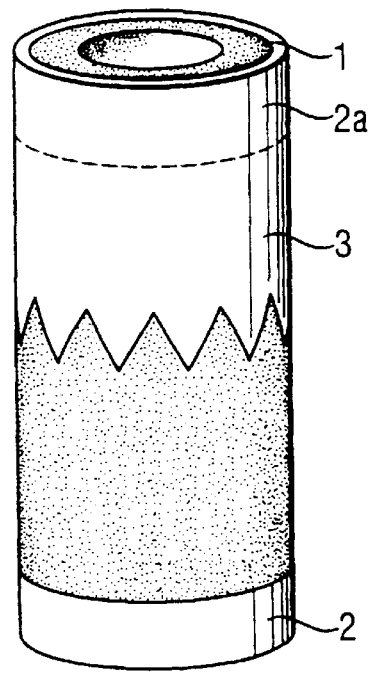

FIG. 1b likewise shows a tubular high-temperature superconductor component with a tube of high-temperature superconductor material (1), which has end sections 2 and 2a, end section 2a being designed as a contact such that the safety conductor (3) sheathing the tube of high-temperature superconductor material merges smoothly into the end section 2a and thereby forms a contact. About at the middle of the current-carrying section, the contact between the safety conductor (3) and the high-temperature superconductor material (1) is reduced by the safety conductor having tooth-shaped holes.

Figure 1C:
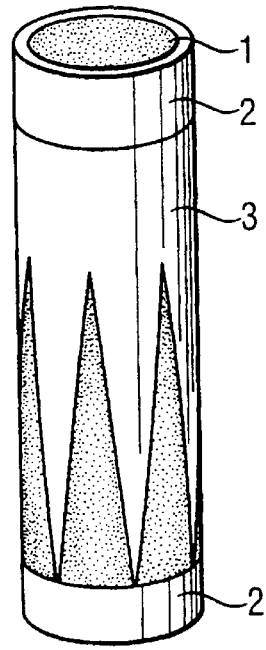

FIG. 1c shows a rod-shaped, bulk high-temperature superconductor component, in which a rod of high-temperature superconductor material (1) has two end sections (2) designed as contacts and the current-carrying section is enclosed by a safety conductor (3). The safety conductor (3) likewise has triangular holes which cause a gradual reduction in the contact between the safety conductor (3) and the high-temperature superconductor material (1). In this case, the safety conductor is electrically connected to both end sections (2) designed as a contact.

Figure 1D:
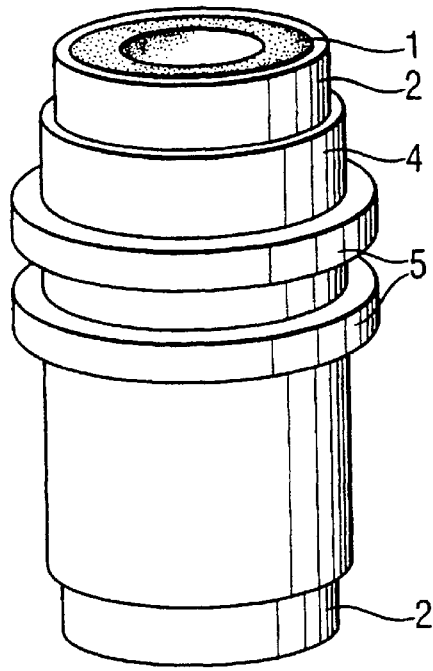

FIG. 1d shows a tubular high-temperature superconductor component with a tube of high-temperature superconductor material (1), end sections (2) designed as contacts, a safety conductor (not shown here), a strengthening layer (4) and two heat sinks (5) lying in the shape of a ring on the strengthening layer.

The high-temperature superconductor component according to the invention is preferably produced using high-temperature superconductor materials which can be processed in the scope of casting or spin-on processes. The use of high-temperature superconductor materials of the BSCCO-2212 or BSCCO-2223 type is particularly preferred in the scope of the present invention.

The safety conductor may in this case be brought into contact with the high-temperature superconductor material either before, during or after the formation of the high-temperature superconductor properties of the high-temperature superconductor material.

In a preferred embodiment, the high-temperature superconductor component is brought into contact with the safety conductor by providing the inner wall of a suitable mold, which for example may also be used by rotating it for spin-on processes, with a layer suitable as the safety conductor, for example a corresponding metal sheet, and subsequently casting the high-temperature superconductor material (which need not necessarily yet be in its final form exhibiting the high-temperature superconductor properties).

The invention therefore also relates to a process for the production of a high-temperature superconductor component according to the invention, in which the inside of a mold is lined with a metal sheet containing Ag, Au, Pt, Rh, Pd, Ru, Os or Ir or a mixture of two or more thereof, and a melt of a material which, where appropriate after corresponding subsequent treatment, exhibits high-temperature superconductor properties is applied to the mold.

It is in this case unimportant whether use is made of a casting method with a stationary or a moving mold, for example spin-on casting.

A further possible way of externally applying the safety conductor consists in applying high-temperature superconductor material to the component by a corresponding coating method, for example a plasma method or sputtering.

In order to produce the high-temperature superconductor properties, it may for example be necessary to subject the entire component, that is to say high-temperature superconductor material and safety conductor, in corresponding form, to a subsequent treatment, for example by annealing, in order to modify the high-temperature superconductor properties. Such annealing is frequently carried out in an atmosphere containing oxygen.

The strengthening layer may be applied to the high-temperature superconductor component in any desired way after the fabrication of the high-temperature superconductor material. If the safety conductor forms the surface of the high-temperature superconductor component, then it is advantageous if the strengthening layer is applied, for example, by soldering or other metallic connection to the safety conductor or to the surface of the high-temperature superconductor material. If appropriate, this may also be done for example by drilling and corresponding screwing or other fastening devices.

The invention also relates to the use of a high-temperature superconductor component according to the invention, or a high-temperature superconductor component produced using a process according to the invention, as a current lead.

The invention will be explained in more detail below with examples.

EXAMPLES

The currents given below refer to a current flow at which a voltage drop of 1 $\mu$V/cm is measured on the high-temperature superconductor component.

Example 1

A tube with external diameter 8 mm and length 100 mm was formed from a 0.2 mm thick metal sheet of an alloy of 97% by weight Ag and 3% by weight Au. This structure was inserted into a quartz glass tube, closed at one end, with internal diameter 8 mm and length 120 mm as a shell. A mixture of bismuth, strontium, calcium and copper oxides in a ratio between the metals of 2:2:1:2 was heated to 1000° C. until a homogeneous melt was formed. This melt was then poured into the prepared quartz tube. After cooling to room temperature, the solidified melt, now encased by the metal plate originally inserted into the shell, was removed from the quartz tube. The encased rod obtained in this way was heated to 750° C. in a furnace in a mixture of air and oxygen (1:1), kept there for 24 hours and subsequently re-annealed at 830° C. under air. The component obtained in this way became high-temperature superconductive at 90 K and, at 77 K (in liquid nitrogen, $lN_2$), carried a superconductive current (1 $\mu$V/cm) of 480 A. When the sample under 450 A was removed from the nitrogen bath, so that one contact remained in the bath, the component could still conduct the current for several minutes without damage taking place. The contact no longer lying in the nitrogen bath was in this case at a temperature of 120 K.

Example 2

A tube with diameter 70 mm and length 100 mm was formed from a 0.25 mm thick silver plate. One end of this tube was in this case not designed smoothly, but in the form of a serrated crown (see FIG. 1b). Another silver tube with length 20 mm and diameter 70 mm was also formed. Both tubes were placed at the ends in a tubular 200 mm long steel mold (shell) so that an 80 mm long silver-free region was left in the middle. A mixture of bismuth, strontium, calcium and copper oxides in a ratio between the metals of 2:2:1:2 plus 10% by weight $SrSO_4$ was heated to 1100° C. until a homogeneous melt was obtained. The shell was set in rotation and enough melt was poured into the shell to provide a 5 mm thick layer of solidified melt after cooling.

After cooling to room temperature, the molding, now partially encased by silver, was removed from the shell. It was then re-annealed according to the conditions in Example 1 and the solidified melt was converted to the high-temperature superconductor phase. The tubular component thus obtained exhibited a critical current of 6486 A (1 µV/cm) at 77 K. A constant 6000 A current was then applied and the sample was removed slowly from the liquid nitrogen bath. Due to the heating, the tube lost its high-temperature superconductor property, but the current was nevertheless sustained until a voltage of 18 mV was reached over the entire length of the tube (after about 500 s) and only thereafter reduced slowly to 0 over a further 120 seconds. The tube then only had its lower half (the silver-free half) in the liquid nitrogen bath. The region of the tube protruding from the nitrogen bath was in this case at a temperature of up to 110 K, which is significantly above the critical temperature. The tube therefore carried a current of 6000 A in the normal—conduction state. After recooling to 77 K had been carried out, the sample exhibited the same critical current as before the test.

Example 3

A 0.3 mm thick and 160 mm wide metal sheet of 95% by weight Ag and 5% by weight Au had two 0.2 mm thick silver plates (100% Ag) measuring 30 mm and 60 mm in width, respectively, welded to it, one on the right and one on the left. A tube with diameter 70 mm and length 250 mm was then formed from this composite. This tube was fitted into a corresponding steel mold (shell) and rotated. As described in Example 2, a metal oxide melt was poured into the shell until it gave a 7 mm thick wall. The tube obtained in this way was re-annealed as described in Example 2 and exhibited high-temperature superconductivity below 90 K. At 77 K it had a critical current of 6006 A. This high-temperature superconductor tube with an AgAu case then had a steel case of thickness 2 mm, consisting of 4 individual tube segments, soldered to it in such a way that, at the upper and lower ends of the tube, a 20 mm long piece of Ag-coated tube was still exposed in each case. In addition, 28 mm wide copper rings were also soldered on as heat sinks.

At a temperature of 77 K, a current of 5500 A was applied to the tube. The sample was then removed rapidly from the liquid nitrogen bath as far as one contact. As a result of the subsequent heating, the tube lost its high-temperature superconductor property, but the current was nevertheless sustained until a voltage of 40 mV was reached over the length of the tube for about 105 seconds after removal of the cooling, and only then reduced slowly to 0 over a further 60 seconds approximately. The tube therefore carried the 5500 A current without cooling in the normal-conduction state. After recooling to 77 K, the sample exhibited the same high-temperature superconductor critical current as before the test.

Example 4

A rod with diameter 12 mm and length 120 mm was made from a homogeneous powder mixture of 100 parts by weight YBCO-123, with 9 parts $Y_2O_3$ and one part $PtO_2$ by means of cold isostatic compression. This article was then sinte red at 880 to 920° C. and partially melted at 1040° C. After cooling to 970° C., the 123 phase was crystallized out by further slow cooling. In this way, a rod with diameter 10 mm and length 110 mm was obtained. Next, by means of thermal spraying, a 0.18 mm thick layer of silver was applied over a length of 45 mm to one end of the rod and over a length of 10 mm at the other end of the rod. The component was then subjected to heat treatment in oxygen at between 400 and 600° C. for 100 hours. In this way, a high-temperature superconductor component with a critical temperature of 92 K and end sections designed as contacts at both ends was obtained. The component exhibited the protective action described above on loss of the high-temperature superconductor properties.

Example 5

A rod was produced according to Example 4, but using a precursor powder with composition $Bi_{1.73}$, $Pb_{0.4}$, $Ca_{1.9}$, $Sr_{2.0}$, $Cu_{3.0}$ and $O_x$. It was subsequently subjected to a reactive anneal at 825° C. (120 h in $N_2+1\% O_2$). In this way, a high-temperature superconductor rod with a critical temperature of 110 K was produced. Next, as presented in Example 4, a silver layer was applied to both ends. This high-temperature superconductor component also exhibited the protective effects described above on loss of the high-temperature superconductor properties:

Comparative Example

A high-temperature superconductor component was produced according to Example 2, but in it, no safety conductor was applied in the current-carrying section. The shell was merely covered at both ends with, in each case, a silver tube with diameter 70 mm and length 20 mm, for which the end sections were formed as contacts. By means of spin-on casting, a tube was then produced according to Example 2 and re-annealed. The component obtained exhibited a critical current at 6656 A at 77 K. The component was then removed from the nitrogen bath under a current flow of 6000 A according to Example 2. After merely 45 s, a voltage drop in the region of the upper 32 mm of the tube (that is to say on the end protruding from the nitrogen bath) occured, and lead within a further 5 s to complete destruction of the component. An about 5 cm² large piece broke off from the component. Outside the region finally destroyed, a voltage drop of merely 8 µV was observed over the entire time. The total energy was consequently released within the segment subsequently destroyed.

What is claimed is:

1. A high-temperature superconductor component with a high-temperature superconductor cross-sectional area of at least 1 mm², which has a current-carrying section, the current-carrying section being connected to a safety conductor which is designed and arranged in such a way and is in electrical contact with the current-carrying section and at least partially covers the latter in a safety region or is at least partially enclosed by the latter, in such a way that the current flowing in the safety region of the current-carrying section on transition of the high-temperature superconductor to normal conduction in this safety region is essentially fully taken up for a period of at least 1 second without damage and rerouted by the safety conductor the safety region making up at least 10% of the surface of the current-carrying section.

2. The high-temperature superconductor component as claimed in claim 1, distinguished by a round, oval or polygonal cross-sectional area.

3. The high-temperature superconductor component as claimed in claim 2, wherein the cross-sectional area is a triangular, quadrilateral, pentagonal or hexagonal cross-sectional area.

4. The high-temperature superconductor component as claimed in claim 1, which is designed as a tube or as a rod.

5. The high-temperature superconductor component as claimed in claim 1, wherein the current-carrying section is continuously and uninterruptedly in full conducting contact with the safety conductor via at least 10% of its surface area.

6. The high-temperature superconductor component as claimed in claim 1, wherein the safety conductor contains an element selected from the group consisting of Ag, Au, Pt, Rh, Pd, Ru, Os or Ir or two or more thereof.

7. The high-temperature superconductor component as claimed in claim 1, wherein the safety conductor has a thickness of from 20 $\mu$m to 800 $\mu$m.

8. The high-temperature superconductor component as claimed in claim 1, wherein a ceramic material containing the elements Cu and O as well as:

a) Bi, Sr, Ca or b) Pb, Bi, Sr, Ca or c) Tl, Pb, Ba, Sr, Ca or d) Hg, Ba, Ca or e) Hg, Pb, Ba, Ca or f) RE, Ba, where RE is at least one of Y, Nd, Sm, Eu, La, Gd, Dy, Ho, Er, or Yb is used as the high-temperature superconducting material.

9. The high-temperature superconductor component as claimed in claim 1, which has a reinforcing layer at least in sections in contact with the surface of the current-carrying section or with the surface of the safety conductor or with both surfaces.

10. The high-temperature superconductor component as claimed in claim 9, wherein the reinforcing layer is a metal layer having a thickness of from 40 $\mu$m to 10 mm.

11. The high-temperature superconductor component as claimed in claim 9, wherein the reinforcing layer contains Cu, Fe, Ni or Ag.

12. The high-temperature superconductor component as claimed in claim 9, wherein, on the reinforcing layer, one or more sections are extensively connected to a metal whose heat capacity is greater than that of the reinforcing layer.

* * * * *